United States Patent
Cox et al.

[19]

[11] Patent Number: 6,141,786
[45] Date of Patent: Oct. 31, 2000

[54] METHOD AND APPARATUS FOR PERFORMING ARITHMETIC OPERATIONS ON GALOIS FIELDS AND THEIR EXTENSIONS

[75] Inventors: Charles Edwin Cox, San Jose; Martin Aureliano Hassner, Mountain View, both of Calif.; Barry Marshall Trager, Yorktown Heights; Shmuel Winograd, Scarsdale, both of N.Y.

[73] Assignee: Intenational Business Machines Corporation, Armonk, N.Y.

[21] Appl. No.: 09/090,511

[22] Filed: Jun. 4, 1998

[51] Int. Cl.[7] .................................................. G11C 29/00
[52] U.S. Cl. .......................... 714/763; 708/492; 714/781
[58] Field of Search .................................. 714/784, 785, 714/781, 763; 708/492

[56] References Cited

U.S. PATENT DOCUMENTS

| | | | |
|---|---|---|---|
| 4,162,480 | 7/1979 | Berlekamp | 714/784 |
| 4,251,875 | 2/1981 | Marver et al. | 708/492 |
| 4,555,784 | 11/1985 | Wood | 714/785 |
| 4,587,627 | 5/1986 | Omura et al. | 708/492 |
| 5,227,992 | 7/1993 | Lee et al. | 708/492 |
| 5,689,452 | 11/1997 | Cameron | 708/492 |
| 5,812,438 | 9/1998 | Lan et al. | 708/492 |

*Primary Examiner*—Albert De Cady
*Assistant Examiner*—Guy Lamarre
*Attorney, Agent, or Firm*—R. Bruce Brodie; Marc D. McSwain

[57] ABSTRACT

The invention relates to an arithmetic unit (AU) in combination with an algebraic block ECC decoder for controlling errors in an electronically recorded digital data message by performing at least one of a plurality of predetermined arithmetic operations on the data message in one or more of a plurality of subfields of a first $GF(2^{12})$ or a second $GF(2^8)$ finite field. The arithmetic operations are selected either from a first group of operations associated with a first subfield $GF(2^4)$ as cubically extended to the first finite field $GF(2^{12})$ or as quadratically extended to the second finite field $GF(2^8)$, or selected from a second group of operations associated with a second subfield $GF(2^6)$ as quadratically extended to the first finite field $GF(2^{12})$.

13 Claims, 7 Drawing Sheets

ECC READ PROCESSOR INCLUDING
GALOIS FIELD ARITHMETIC UNIT

FIG. 1 (PRIOR ART) CONTROL AND DATA FLOW IN SCSI ATTACHED DASD

FIG. 2

QUADRATIC EXTENSION FROM ELEMENTS IN THE GALOIS SUBFIELD $GF(2^4)$ TO A LARGER FIELD $GF(2^8)$ AND CUBIC EXTENSIONS FROM $GF(2^4)$ TO $GF(2^{12})$

FIG. 3A

| 1 | t | u | ut | v | vt | uv | tuv | $v^2$ | $tv^2$ | $uv^2$ | $tuv^2$ |
|---|---|---|----|---|----|----|----|----|----|----|----|
| $a_0$ | $a_1$ | $a_2$ | $a_3$ | $a_4$ | $a_5$ | $a_6$ | $a_7$ | $a_8$ | $a_9$ | $a_{10}$ | $a_{11}$ |

$[a_0 + a_1t + (a_4 + a_5t)v + (a_8 + a_9t)v^2] + [(a_2 + a_3)t + (a_6 + a_7t)v + (a_{10} + a_{11}t)v^2]u = A + Bu$ (QUADRATIC EXTENSION OF $GF(2^6)$)

QUADRATIC EXTENSION FROM ELEMENTS IN GALOIS SUBFIELD $GF(2^6)$ TO THE FIELD $GF(2^{12})$ USED IN LOGARITHMIC AND OTHER TABLE-BASED OPERATIONS

FIG. 3D  COMPUTATION OF FIRST FACTOR (65a) IN LOGARITHM OPERATION QUADRATICALLY EXTENDED FROM $GF(2^6)$ TO $GF(2^{12})$

*FIG. 3E*  COMPUTATION OF SECOND FACTOR (63b) IN LOGARITHM OPERATION QUADRATICALLY EXTENDED FROM $GF(2^6)$ TO $GF(2^{12})$

FIG. 4

METHOD AND APPARATUS FOR PERFORMING ARITHMETIC OPERATIONS ON GALOIS FIELDS AND THEIR EXTENSIONS

FIELD OF THE INVENTION

This invention relates to controlling errors in an electronically recorded digital data message by performing at least one of a plurality of predetermined arithmetic operations on the data message in one or more of a plurality of subfields of a first $GF(2^{(m)(p)})$ or a second $GF(2^{(m)(q)})$ finite field.

DESCRIPTION OF RELATED ART

Both the storage capacity and the byte transfer rate of datastreams to and from moving magnetic and optical storage devices has increased significantly in the recent past. In the 1970s, datastreams were written out to and read from tracked storage devices, such as disk and magnetic tape, as variable-length records. It became apparent even then that fixed-length blocking would aid both data transfer and storage management efficiency. One of the frequently used device level standards since the late 1970s was the recordation of data characters in 8-bit bytes (28-code capacity) in blocks of 512 bytes at the storage track level. The inexorable appetite for speed and efficiency now requires data characters in 12-bit bytes in blocks of 4000 bytes. This creates a backward and a forward compatibility problem.

Backward and forward compatibility in the context of differing character and block sizes means that an information handling system (IHS) can efficiently execute applications and their associated data sets notwithstanding the character and block size variation. Unfortunately, the data path to and from a storage subsystem to the IHS is tuned to a single character and block size. The prior art solutions include separate facilities specific to each character and block size, very elaborate and computationally intensive format conversions, and direct modifications to ECC processing as by quadratic extensions of ECC codes over selected Galois fields.

In order for storage devices such as tracked, cyclic, magnetic and optic disk drives and tapes to maintain high data transfer rates, they ideally must stream data either onto or from the device. Because ECC processing is located in the recording and readback paths of each storage device, this imposes an on-the-fly processing requirement for the ECC function. However, sustained on-the-fly detection and correction processing is very computationally intensive, especially where the ECC function uses algebraic block coding of data in the detection and correction of errors and erasure.

Reed-Solomon (RS) codes are among the most popular ECC codes. Also, RS codes are considered to have attributes both of algebraic block and linear cyclic codes. While RS codes possess many desirable characteristics, they are computationally intensive. That is, when data is read back from a disk drive, its on-the-fly RS code aspects must be handled by a special purpose computer or microprocessor and associated facilities. One prior art regime for processing RS codes with different-sized characters defined over different-sized fields is described in Cameron, U.S. Pat. No. 5,689,452, "Method and Apparatus for Performing Arithmetic in Large Galois Field $GF(2^n)$", issued Nov. 18, 1997. Before discussing Cameron, it is believed desirable to briefly describe computational aspects of RS codes.

It is known that an RS code is one in which every codeword $c(z)$ in an (n,k) linear cyclic code over a finite Galois field $GF(2^m)$ is generated by dividing a block of data $m(z)$ by a generator polynomial $g(z)$ and adding the remainder thereto modulo 2. In this regard, RS codewords are conventionally represented as a collection of coefficients of a rational polynomial of an arbitrary place variable z in low-to-high order. A received or readback codeword $r(z)=c(z)+e(z)$, where $c(z)$ was the codeword originally transmitted or recorded and $e(z)$ is the error. Relatedly, a syndrome polynomial $S(z)$ is informally defined as $S(z)=r(z) \bmod g(z)$. Thus, $r(z)=c(z)$ if and only if $g(z)$ divides into $r(z)$ with a remainder of zero, i.e., $S(z)=0$. Otherwise, it can be shown that $S(z)$ is dependent only on the error function $e(z)$ such that $S(z)=e(z) \bmod g(z)$.

An RS code comprises a set of vectors over a finite field F having $p^m$ elements, where p is a prime number and m is an integer. The elements of the field F are identified with either of two attributes. That is, they are identified with the $p^m-1$ powers of a distinct element "a" and the symbol "0". Alternatively, they are identified with the set of polynomials of degree of at most m−1 and with the coefficients in the field of integers modulo p. For purposes of convenience, let $p^m=2^8=256$ such that the order of the field F is fixed. In this RS code, all operations are performed modulo 2. The field is also denominated a Galois field (GF) after its inventor. In this case, the field $GF(2^8)$ can be constructed from a primitive polynomial $p(z)$ irreducible over and with coefficients in GF(2), where $p(z)=z^8+z^6+z^5+z+1$, and where "a" is a primitive root of the polynomial.

The defining property of an RS code C is that all vectors $c=(c_0, c_1, \ldots, c_{254}) \in C$ satisfy the relations for a given set of numbers j:

$$\sum_{k=0}^{k=254} c_k a^{jk} = 0 \bmod p(z)$$

E. R. Berlekamp, "Algebraic Coding Theory", McGraw-Hill Publishing Co., copyright 1968, pp. 178–199, showed that if a linear error correction code had a distance 2t+1 between codewords, then the syndrome $S(z)$ over a codeword $c(z)$ could be expressed by the recursion:

$$S(z) = \sum_{k=0}^{k=(2t-1)} S(z^k) = \frac{w(z)}{\sigma(z)} \bmod(z^{2t})$$

Where $z^i$ is a polynomial presentation of the codeword $c(z)$, $w(z)$ is the error evaluator polynomial and $\sigma(z)$ is the error locator polynomial. This has been denominated as the "key equation". Relatedly, Berlekamp showed that the locations of errors within a received codeword r are determined by the index positions j of $a^j$ as the roots of the locator polynomial $\sigma(z)=\sigma(a^k)=0$.

One configuration for detecting and correcting RS codewords as they are read back from a disk track comprises a register for accumulating the syndromes, a key equation solver (KES) for ascertaining the error locator and evaluator polynomials, an arithmetic unit (AU) for performing Galois field operations, and a sequencer. The computational intensity involves the KES and the AU, especially in finding the roots of the polynomials in the key equation.

The Cameron patent discloses an arithmetic unit for processing pairs of number symbols in an extended Galois field in which the multiplicative structure of the finite field is determined by defining it in terms of multiple primitive polynomials. Cameron's advance is pertinent only to those fields $GF(p^m)$, where m is a composite number. That is, where m is equal to the product of $p_1 p_2 \ldots p_j$. In turn, the structure of the field is determined by "j" primitive polynomials where the degree of polynomial $F_j = p_j$. For instance, where $m = p_1 p_2 = 8(2) = 16$ for representation in a field $GF(2^{16})$, then subfields could be constructed from primitive polynomials $F_1$ and $F_2$, where $F_1(x) = x^8 + x^5 + x^3 + x + 1$ over $GF(2)$ and $F_2(x) = x^2 + x + 1$ over $GF(2^8)$. Advantageously, operations defined over $GF(2^{16})$ could be directly calculated in terms of operations performed in either or both of the subfields $GF(2)$ and $GF(2^8)$. He went on to assert that operations including multiplication, inversion, squaring, etc. may be performed in a large field utilizing operations from the subfield. Thus, a quadratic extension of a subfield $GF(2^s)$ to a larger field $GF(2^t)$ can be made with a primitive polynomial of the form $x^2 + x + b$, where b is an element from the subfield $GF(2^{rs})$.

SUMMARY OF THE INVENTION

It is an object of this invention to devise an efficient machine implementable method and apparatus for performing arithmetic operations in a Galois field $GF(2^{12})$ as an extension of operations in subfields thereof.

It is a related object that said method and apparatus be utilized in connection with the detection and correction processing of errors in data expressed in words of algebraic block ECC codes, such as Reed-Solomon codes or the like.

It is also an object that said method and apparatus be switchably operable in the detection and correction of ECC codewords as elements of either a first $GF(2^{12})$ or a second $GF(2^8)$ finite field.

It is still another object that such method and apparatus minimize computational resources in effectuating their numeric operations.

The foregoing objects are believed satisfied by a method and apparatus for controlling errors in an electronically recorded digital data message. This is attained by performing at least one of a plurality of predetermined arithmetic operations on the data message in one or more of a plurality of subfields of a first $GF(2^{(m)(p)})$ or a second $GF(2^{(m)(q)})$ finite field. In the invention, a first, second, and third composite number (m)(p), (m)(q), (p)(q) are respectively factored. Relatedly, the first and second composite numbers are the number of bits designating each element in the first $GF(2^{(m)(p)})$ and second $GF(2^{(m)(q)})$ finite fields.

Next, a first primitive polynomial is formed for cubically extending each element in a first subfield $GF(2^{(m)})$ to the first finite field $GF(2^{(m)(p)})$. A second primitive polynomial is formed for quadratically extending each element in the first subfield $GF(2^{(m)})$ to the second finite field $GF(2^{(m)(q)})$, $q \neq p$. Lastly, a third primitive polynomial is formed for quadratically extending each element in a second subfield $GF(2^{(p)(q)})$ to the first finite field $GF(2^{(m)(p)})$.

At least one of the plurality of predetermined arithmetic operations is performed on the data message. This results from utilizing an arithmetic unit coupled to receive the data message. The arithmetic operations are selected either from a first group of operations associated with the first subfield $GF(2^{(m)})$ as cubically extended to the first finite field $GF(2^{(m)(p)})$ or as quadratically extended to the second finite field $GF(2^{(m)(q)})$, or selected from a second group of operations associated with the second subfield $GF(2^{(p)(q)})$ as quadratically extended to the first finite field $GF(2^{(m)(p)})$. It follows that the selected arithmetic operation is performed in the associated subfield.

In this invention, the first and second finite fields are respectively $GF(2^{12})$ and $GF(2^8)$, and the first and second subfields are respectively $GF(2^4)$ and $GF(2^6)$. The first group of operations includes multiplication, the inverse function, addition, and table-driven logarithmic functions, while the second group of operations includes the inverse function. The first primitive polynomial is of the form $(v^3 + v + 1)$, and the second and third primitive polynomials are of the form $(u^2 + u + 1)$.

The apparatus of the invention involves logic for decoding Reed-Solomon codewords in a large Galois field of $GF(2^{12})$ wherein arithmetic operations for the extension field are expressed as a cubic extension of operations in the Galois subfield $GF(2^4)$, and for switchably decoding RS-coded words in a smaller Galois field of $GF(2^8)$ wherein arithmetic operations are expressed as a quadratic extension of operations also in the smaller Galois subfield $GF(2^4)$.

As may be recalled, syndromes are derived from RS words as the words are decoded. They are processed by the Key Equation Solver (KES) in order to evaluate computationally intensive error locator polynomials in a Galois field. Relatedly, the judicious use of quadratic and cubic extensions from $GF(2^4)$ radically enhances the efficiency of any arithmetic unit interacting with the KES. First, the complexity of circuits performing multiplication and division in the arithmetic unit is reduced by several orders of magnitude where the operations are performed as quadratic and cubic extensions from $GF(2^4)$ selectively in either $GF(2^8)$ or in $GF(2^{12})$. Second, logarithmic and exponentiation operations utilize tables parsimonious in size and fast of access, such as in a quadratic extension from $GF(2^6)$ to $GF(2^{12})$. Third, towers of extensions and switching can be constructed between other prime number subfields and their larger field extensions. Consequently, either 8-bit or 12-bit RS words can be ECC processed on the fly by the same facility, arithmetic operations simplified in implementation, and the size of table-driven operations drastically reduced.

DESCRIPTION OF THE PREFERRED EMBODIMENT

The following paragraphs are directed to briefly describing the storage subsystem context where ECC codewords are written and from which they are decoded. Next, focus is placed on the ECC decoder having a processor interacting with a Galois field arithmetic unit (AU). The central portion of the description discusses the computational efficacy and logic implementation in the Galois field AU for performing different types of arithmetic operations as quadratic and cubic extensions principally GF($2^4$) extended either to GF($2^8$) or GF($2^{12}$) and GF($2^6$) extended to GF($2^{12}$).

Figure 1:
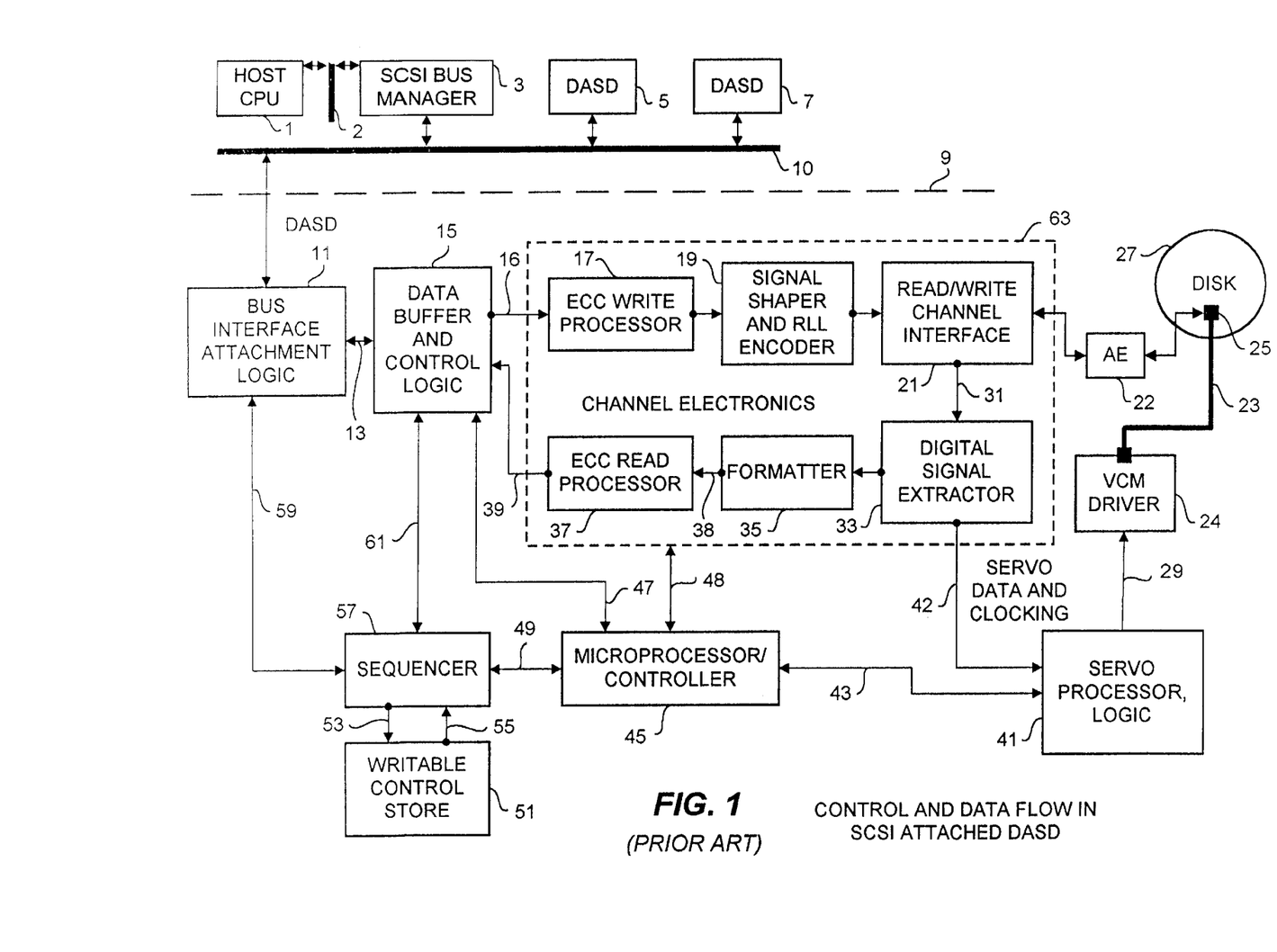
FIG. 1 shows ECC processing in a DASD write and read channel in the prior art.

Referring now to FIG. 1, there is shown the control and data flow for a disk drive 9 attached across a small computer system interface (SCSI) to a host CPU 1 across an SCSI bus 10, a bus manager 3, and a CPU bus 2. Data is streamed out to or derived from addressed tracks on a magnetic or optical disk 27 over a data path while storage (read/write) and access (seek/set sector) commands are processed by a command path, also within the disk drive 9. Commands and data from the host 1 are passed through the interface 11. The commands are interpreted and processed over a path including a sequencer 57, a microprocessor controller 45, servo processor logic 41, and the physical accessing mechanism 23–25 to the cyclic, tracked disk 27. In contrast, data is passed to or from tracks on the disk 27 via the interface 11, a data buffer 15, channel electronics 63, a read/write head 25 adjacent to the recorded data on the track, and amplifier electronics 22.

Writing out data to the disk 27 requires that the 1's and 0's of fixed-length blocks of a datastream be mapped into codewords of an ECC code, such as a Reed-Solomon (RS) code, by an ECC write processor 17. As previously discussed, this involves dividing a fixed-length block by a suitable RS-generating polynomial and appending the remainder to the block. Each RS codeword is then mapped by a signal shaper and encoder 19 into a run-length-limited (RLL) code that is spectrally compatible with the recording channel and disk. The doubly encoded words are then written out to the disk by the channel interface 21 and associated electronics.

Reading data from a cyclic, tracked disk 27 involves extracting a stream of 1's and 0's from a magnitude varying analog signal and from the RLL coding by a signal extractor 33, assembling the 1's and 0's into suitably formatted ECC codewords for processing by an ECC read processor or decoder 37. Since the signals are streamed, the ECC decoder 37 has either to correct any detected errors or erasures on the fly or provide indication that the ECC word is not correctable. The output from the ECC decoder 37 is applied on path 39 to the data buffer 15 for subsequent transmission to the attachment logic 11, etc.

Figure 2:
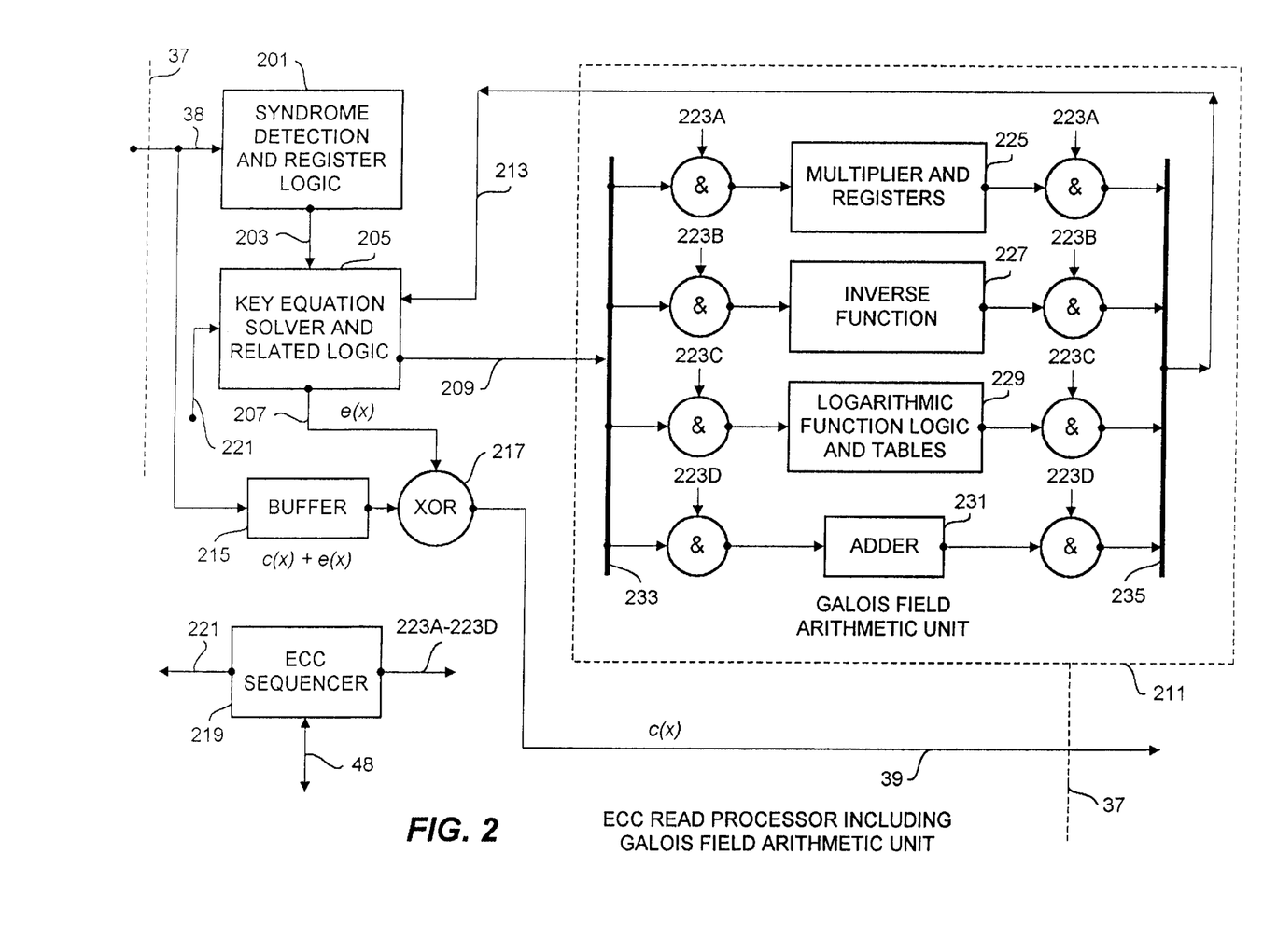
FIG. 2 depicts syndrome and KES processing utilizing a Galois field arithmetic unit in decoding Reed-Solomon codewords.

Referring now to FIG. 2, there is shown the ECC read processor decoder 37 including syndrome and KES processing utilizing a Galois field arithmetic unit in decoding Reed-Solomon codewords. As set out in FIG. 1, each RS codeword c(x) and any error e(x) is applied on the input path 38 concurrently to syndrome detection and register logic 201 and to a buffer 215. The purpose of buffer 215 is to ensure that the time-coincident copy of c(x) is available for modification as the codeword leaves the ECC decoder 37 on path 39 for placement into data buffer 15 as shown in FIG. 1.

If nonzero syndromes are detected by logic 201, this is indicative of error or erasure. In this event, it is necessary to identify the location of the error within the word and the value of the corrected result. This is the function of the Key Equation Solver (KES) and related logic 205 over path 203. The polynomials constituting the error value and their locations are derived from the syndromes by the KES. Other logic within the unit 205 is directed to forming a matrix from each polynomial, extracting roots, and computing error values. Relatedly, one source of computational intensity is extrinsic and is dictated by the error detection and correction on-the-fly requirement. The second source is intrinsic and is dictated by the very large number of multiplicative and additive operations in solving systems of linear equations and the like.

To accommodate the high-speed processing, the KES and related logic 205 interact with a Galois field arithmetic unit (AU) 213, 211 for the production of the many intermediate or partial products and sums over paths 209 and 213. The AU includes independently actuable logic for multiplication 225, inverse operations 227, table-based logarithmic functions 229, and addition 231. Each of these functions is coupled to an input bus 233 accessed via the input path 209 and an output bus 235 driving the output path 213. Also, each of the functions is coupled to the input and output buses by sequence actuable gates 223A–223D. In this regard, an ECC sequencer 219 provides a timing pulse for closing and opening respective gate pairs. For instance, if a pair of operands are applied to path 209 for purposes of multiplication, then left gate 223A is closed and right gate 223A is opened until the operands are loaded in the multiplier function 225. After loading, left gate 223A is opened and right gate 223A is closed for a period to allow any partial or final product to be streamed out from the multiplier 225 to logic 205 over the output bus 235 and path 213. Each of the remaining functions 227, 229, 231 is respectively accessed via the sequencer 219 counterpart actuated gate pairs 223B, 223C, and 223D. ECC sequencer 219 provides a path 221 and timing and other control signals to and from the KES and related logic 205, and to and from the disk drive controller 45 over path 48.

Figure 3A:
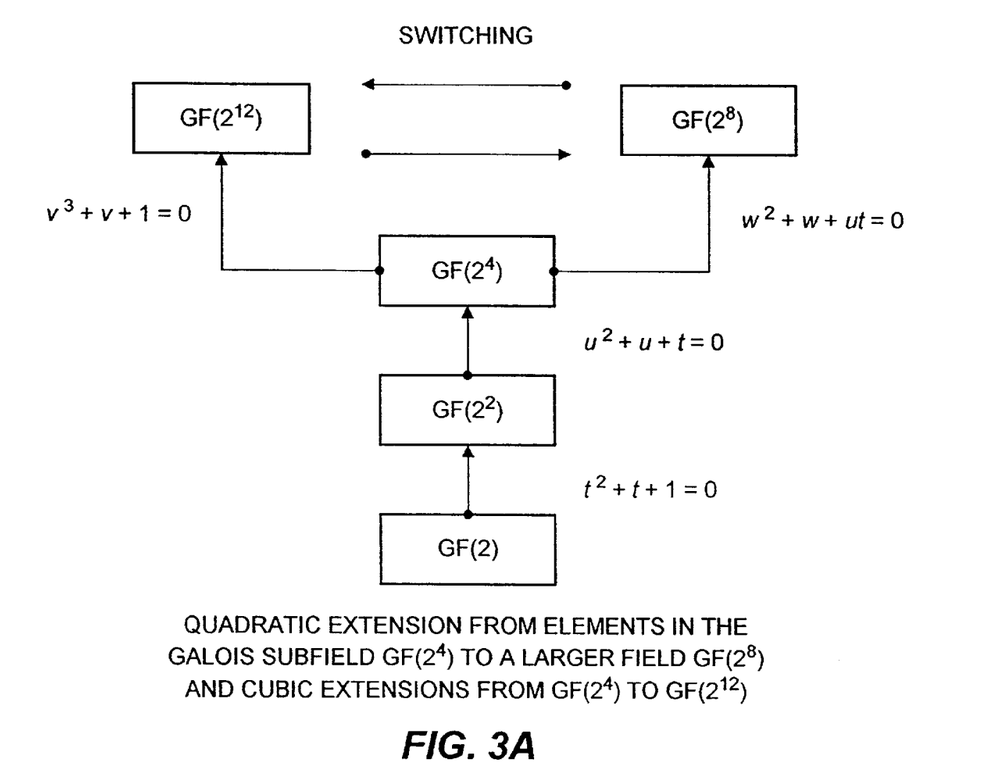
FIG. 3A sets out the quadratic extensions from elements in the Galois subfield $GF(2^4)$ to a larger field $GF(2^8)$, and cubic extensions from $GF(2^4)$ to the still larger field $GF(2^{12})$.
Figure 3B:
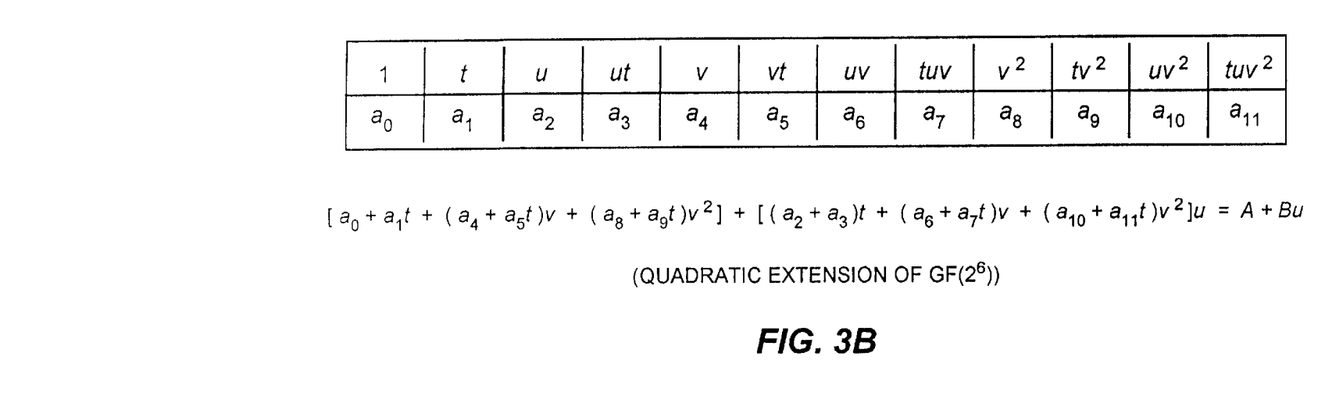
FIG. 3B emphasizes a quadratic extension from $GF(2^6)$ to $GF(2^{12})$ as one permutative arrangement of bits.
Figure 3C:
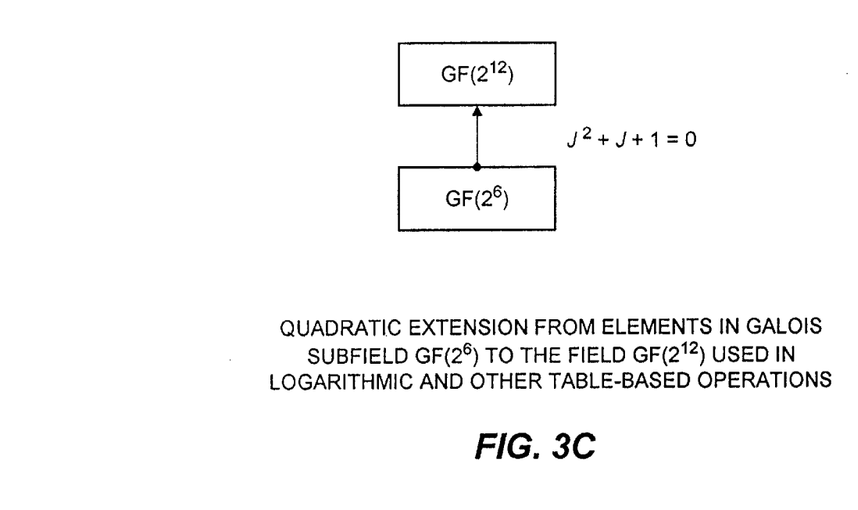
FIG. 3C emphasizes the algebraic expression of the quadratic extension from elements in the Galois subfield $GF(2^6)$ to the field $GF(2^{12})$ of FIG. 3B.

FIG. 3A is based on the unexpected observation that operations in the field GF($2^{12}$) occasioned either quadratic extensions from elements in the Galois subfield GF($2^4$) to larger field GF($2^8$), or cubic extensions from GF($2^4$) to the still larger field GF($2^{12}$) can be given effect by permutative grouping of bits. More particularly, starting with the element t and using an irreducible polynomial equation $t^2+t+1=0$ as a quadratic extension to the field GF($2^2$), then every element r in GF($2^2$) is of the form r=a+bt where a, b $\in$GF(2). The next extension is a quadratic extension obtained by adding the element u to GF($2^2$) and using the irreducible polynomial equation $u^2+u+t=0$. It follows that every element r in GF($2^4$) can be written as r=a+bu where a, b $\in$GF($2^4$). Finally, the field GF($2^{12}$) can be constructed by cubic extension through adding the element v to GF($2^4$) and using the irreducible polynomial equation $v^3+v+1=0$. In this regard, every element r in GF($2^{12}$) can be written as r=a+bv+cv$^2$ where a, b, c $\in$GF($2^4$).

As discussed, the field GF($2^{12}$) can be constructed by first adding t, u, and v in that order. However, since the defining polynomial for v does not depend upon u, then the same end effect could also have been achieved by adding t, v, and u in that order. That is, GF($2^{12}$) could be constructed as a quadratic extension of GF($2^6$) or a cubic extension of GF($2^4$). The change in representation is merely a matter of permuting the bits.

It follows algorithmically that operations in the larger Galois field GF($2^{12}$) can be emulated by operations in GF($2^6$) as quadratically extended, or by operations in GF($2^4$) as cubically extended. This means that it should be feasible to add two elements in GF($2^4$), multiply them together by circuitry or table look-up, and divide them either by circuitry or table look-up and do the same for two elements in GF($2^6$). It follows that some operations, such as multiplication or inversion in GF($2^{12}$), might be most efficiently performed as a cubic extension from GF($2^4$). Other operations in GF($2^{12}$), such as table-driven logarithms, are efficiently performed as a quadratic extension from GF($2^6$).

Figure 3D:
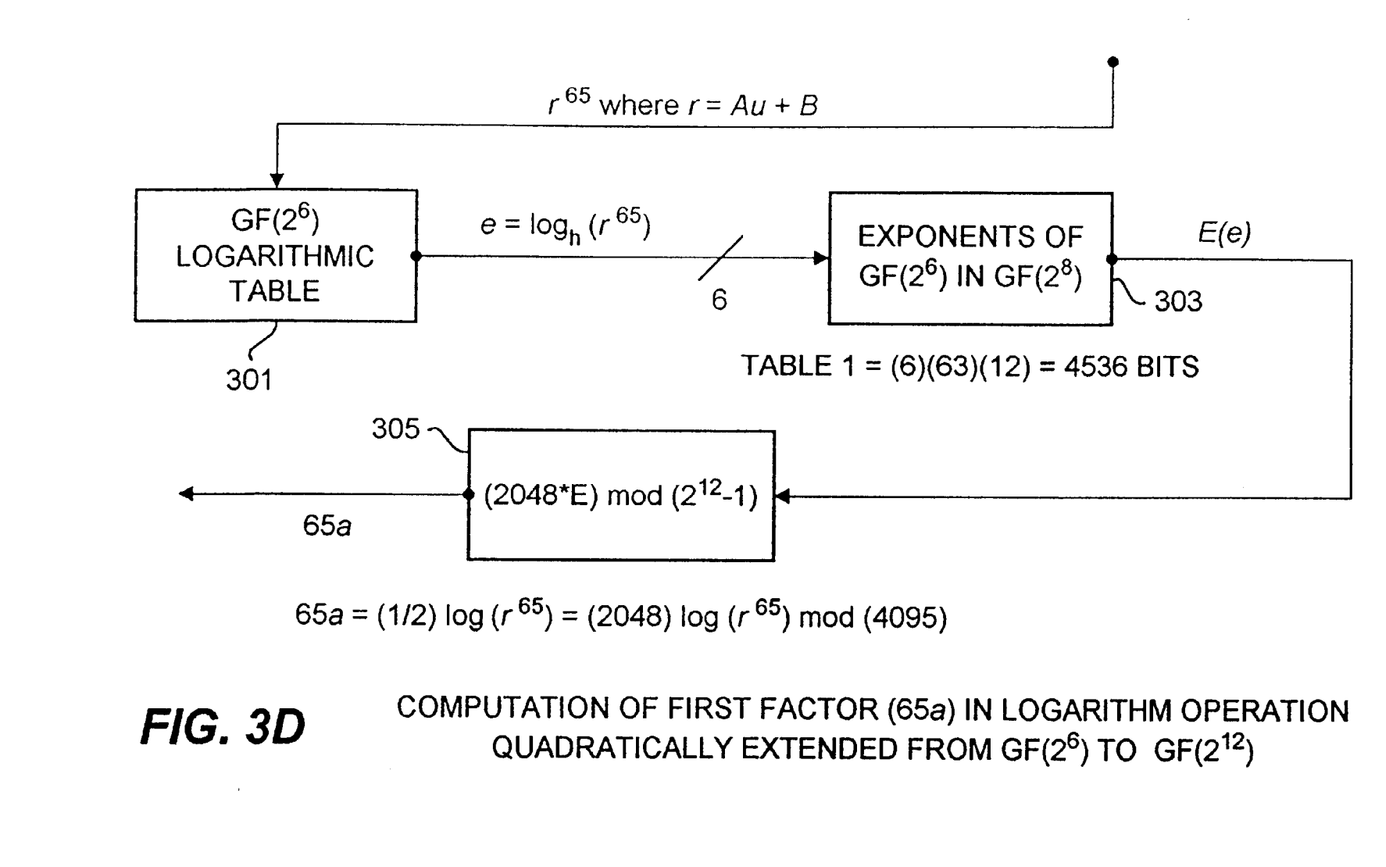
FIGS. 3D and 3E illustrate the efficient computation of factors in a table look-up logarithmic function as quadratically extended from $GF(2^6)$ to $GF(2^{12})$.
Figure 3E:
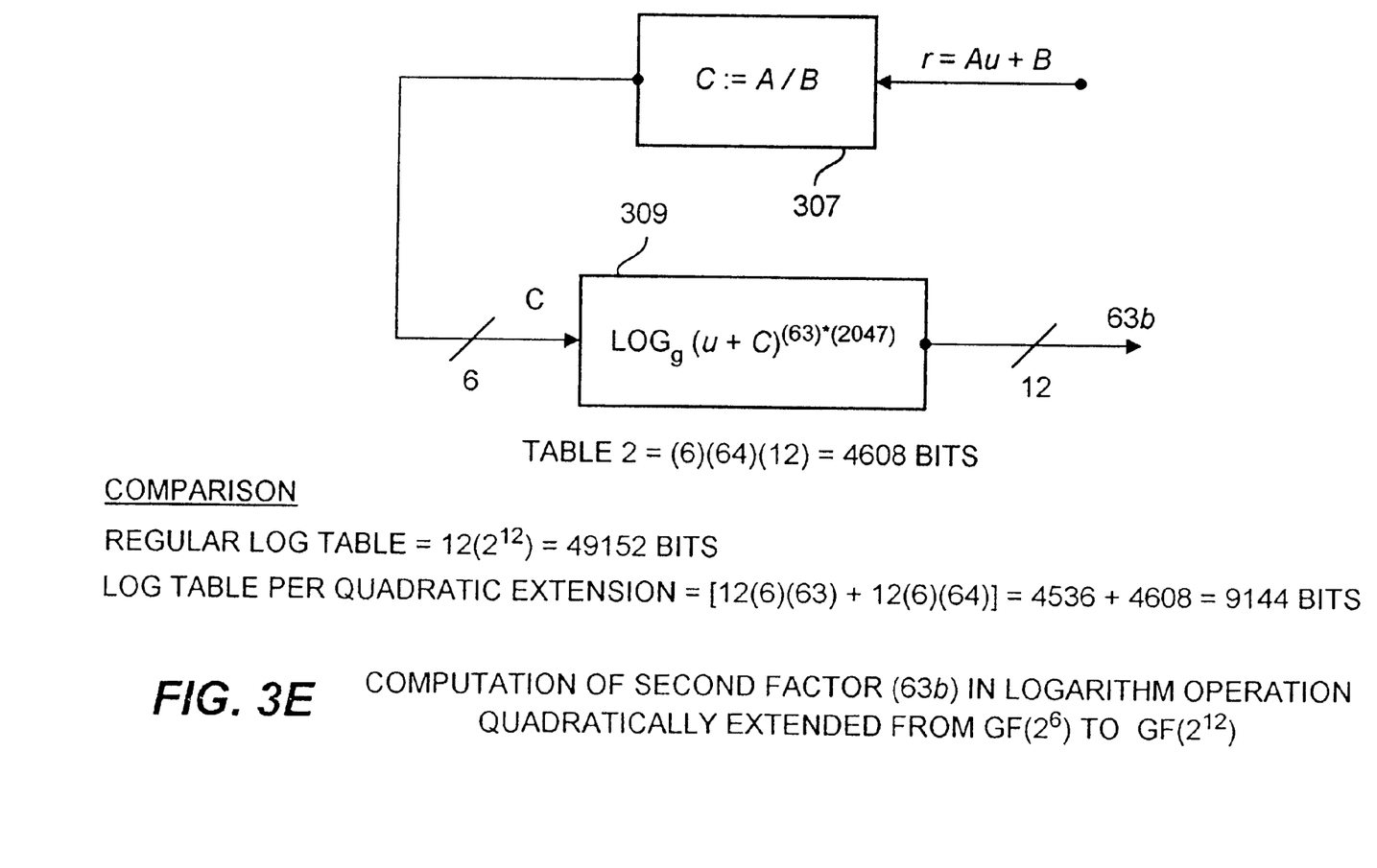
Figure 4:
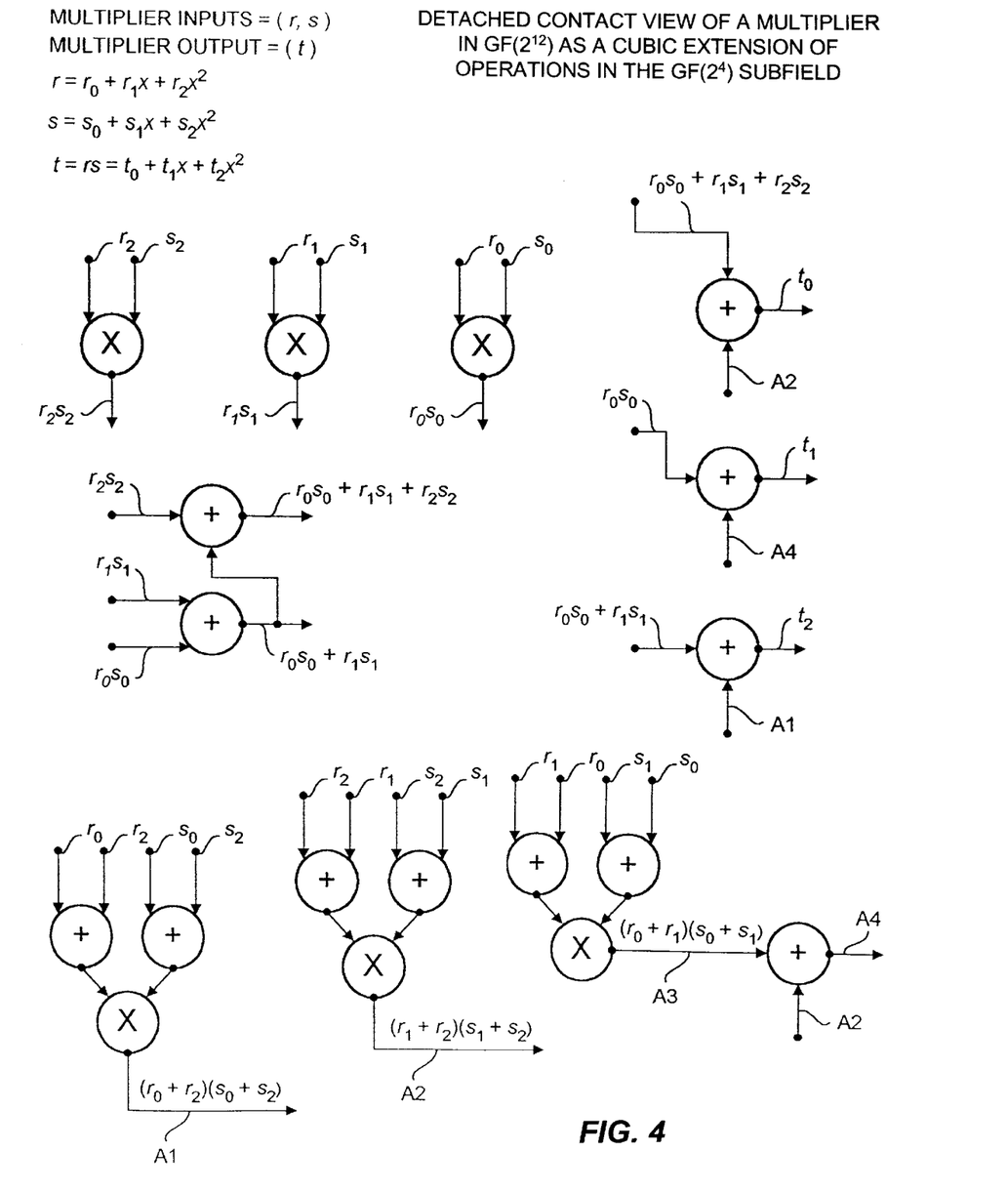
FIG. 4 illustrates a multiplier in $GF(2^{12})$ logic gating as a cubic extension of operations in the Galois $GF(2^4)$ subfield.

Referring now to FIGS. 3A–3E when taken together with FIG. 4, the ensuing discussion will illustrate a first algorithm for determining an inverse arithmetic operation of multiplication, squaring, and inverse in GF($2^4$) and a counterpart multiplication and inverse operation in the extended field GF($2^{12}$). Lastly, a description of table construction as a quadratic extension from GF($2^6$) to GF($2^{12}$) reducing table size some 80 percent will be set out.

Multiplication in GF($2^4$)

Let $r=a_0+ua_1$ and let $s=b_0+ub_1$ where $a_0, a_1, b_0, b_1 \epsilon GF(2^2)$ and where r and s are two elements in GF($2^4$). It follows that multiplying the two elements r and s yields:

$$r*s=(a_0b_0+ta_1b_1)+[(a_0+b_0)(a_1+b_1)+a_0b_0]u$$

where r*s is computable using three multiplications, four additions, and one multiplication by t all within GF($2^2$). Since $(a_0+ta_1)t=a_1+(a_0+a_1)t$, a multiplication by t can be executed by an exclusive OR (XOR) gate or operation.

Squaring in GF($2^4$)

Let $r=a_0+ua_1$ where $a_0, a_1 \epsilon GF(2^4)$ and let r be an element of GF($2^4$). The element r can also be written as $r=a_{0,0}+a_{0,1}t+a_{1,0}u+a_{1,1}ut$ where $a_{x,y} \epsilon GF(2)$. It follows that squaring r:

$$r^2=a_{0,0}+a_{0,1}t^2+a_{1,0}u^2+a_{1,1}u^2t^2.$$

Substituting for the expressions $t^2=t+1$; $u^2=u+t$; $u\,t=ut+u+t^2+t=ut+u+1$, factor:

$$r^2=(a_{0,0}+a_{0,1}+a_{1,1})+(a_{0,1}+a_{1,0})t+(a_{1,0}+a_{1,1})u+a_{1,1}ut$$

The squaring operation uses four XORs.

Inverse Operation in GF($2^4$)

If $r \neq 0$ and $r=a_0+a_1u$ where $a_0, a_1 \epsilon GF(2)$ and where r is an element in GF($2^4$), then a table can be constructed for the inverse $(r^{-1})=1/r$ having 15 entries each $r^{-1}$ of which consists of 4 bits. Alternatively, logic circuitry can be used to perform the inverse operation.

For every nonzero element x in GF($2^4$), $x^3=1$. Thus, for $r=a_0+a_1u$ in GF($2^4$) and $r \neq 0$, then:

$$\begin{aligned}
r^{-1} &= 1/(a_0+a_1u) \\
&= [(a_0+a_1)+a_1u]/[(a_0+a_1u)(a_0+a_1(u+1))] \\
&= [(a_0+a_1)+a_1u]/(a_0^2+a_1^2u^2+a_0a_1+a_1u) \\
&= [(a_0+a_1)+a_1u]/[a_0^2+ta_1^2+a_0a_1] \\
&= [a_0^2+(ta_1)^2+ta_0a_1+a_0^3a^2+a_0^2a_1^3]+[a_0a_1+(ta_1)^2+a_0^2a_1^2]u
\end{aligned}$$

There are three cases of interest, namely, where ($a_0=0$ and $a_1 \neq 0$); ($a_0 \neq 0$ and $a_1=0$); ($a_0 \neq 0$ and $a_1 \neq 0$).

If $a_0=0$, then $r^{-1}=(ta_1)^2+(ta_1)u$. Also, if $a_1=0$, then $r^{-1}=a_0^2$. Lastly, if $a_0 \neq 0$ and $a_1 \neq 0$, then:

$$r^{-1}=t(a_0a_1+a_1^2)+[(a_0+ta_1)^2+a_0a_1]u.$$

By making several substitutions of variables, the inverse $r^{-1}$ for GF($2^4$) can be further reduced.

Let $a_0=a_{0,0}+ta_{0,1}$ and let $a_1=a_{1,0}+a_{1,1}t$, then:

$$a_0^2=(a_{0,0}+a_{0,1})+ta_{0,1}$$

$$(ta_1^2)=a_{1,0}+(a_{1,0}+a_{1,1})t$$

$$a_1^2=(a_{1,0}+a_{1,1})+ta_{1,1}$$

$$(a_0+ta_1)^2=(a_{0,0}+a_{0,1}+a_{1,1})+t(a_{0,1}+a_{1,0}+a_{1,1})$$

$$a_0a_1=(a_{0,0}a_{1,0}+a_{0,1}a_{1,1})+((a_{0,0}+a_{0,1})(a_{1,0}+a_{1,1})+a_{0,0}a_{1,0})t.$$

And for any $r=a_0+ta_1$, then $tr=a_0+(a_0+a_1)t$.

Consequently, the logic gate implementation for ascertaining the inverse is now highly simplified and straightforward.

Inverse Operation in GF($2^6$)

A second algorithm is now set out for computing the inverse in GF($2^6$) for use in GF($2^{12}$).

Let $r=a_0+ua_1$ and $a_0, a_1$ be elements in GF($2^6$) and a nonzero element of GF($2^{12}$), then:

$$r^{-1}=(A_0/d)+(A_1/d)u$$

where $A_0=(a_0+a_1)$, $A_1=a_1$ and $d=(a_0+(t+1)a_1)^2+a_0a_1$.

After expansion and substitution of variables, for every $r=A_0+A_1v+A_2v^2$ as an element of GF($2^6$), then $r^2=A_0^2+A_2^2v+(A_1+A_2)^2v^2$.

Multiplication in GF($2^{12}$)

Referring now to FIG. 4, there is shown a multiplier in GF($2^{12}$) logic gating as a cubic extension of operations in the Galois GF($2^4$) subfield. The multiplier inputs are $r=r_0+r_1x+r_2x^2$ and $s=s_0+s_1x+s_2x^2$, and the multiplier output is $t=t_0+t_1x+t_2x^2=r*s$. In this regard, both r and s are two elements in GF($2^{12}$). The coefficients $t_0$, $t_1$, and $t_2$ of the output vector $t=rs$ are equated to the inputs as follows:

$$t_0=(r_0s_0+r_1s_1)+r_2s_2+(r_1+r_2)(s_1+s_2)$$

$$t_1=r_2s_0+(r_1+r_2)(s_1+s_2)+(r_0+r_1)(s_0+s_1)$$

$$t_2=(r_0s_0+r_1s_1)+(r_0+r_2)(s_0+s_2).$$

The multiplier in FIG. 4 is shown in detached contact form meaning that the principal gate clusters are completely defined by their input and output signals absent connecting lines there between. The cubic extension requires only 6 multiplier gates and 12 addition gates.

Logarithmic Processing in GF($2^{12}$) as a Quadratic Extension of GF($2^6$)

Let $r \neq 0$ and $r=gL$ where L lies in the range $0 \leq L < M$. It follows that $L=\log_g(r)$.

The upper bound M should be a composite or factorable number. Suppose $M=(2^{12}-1)=4095$, then the bound $M=4095$ is factorable as 65(63). Also, it should be noted that the factors 65 and 63 are relatively prime, i.e., gcd(65, 63)=1.

Let $r=Au+B$ where A, B $\epsilon GF(2^6)$, then $r^{65}=At^2+B^2+AB$ $\epsilon GF(2^6)$.

If $L=65a+63b$ where ($0<a \leq 63$) and ($0<b \leq 65$), then:

$$r=g^{65a+63b} \rightarrow L=65a+63b \bmod(2^4).$$

Referring now to FIGS. 3D and 3E, there is illustrated the efficient computation of factors (65a and 63b) in a table look-up logarithmic function as quadratically extended from GF($2^6$) to GF($2^{12}$). In FIG. 3D, the first factor 65a is determined as a three-step process. It starts by performing a 6-bit table look-up of the logarithmic value of $\log_h(r^{65})$ in GF($2^6$) arithmetic in step 301. This operand is then applied to a table of exponents in GF($2^8$) arithmetic in step 303. Lastly, the factor is computed in step 305 according to the function (2048)log($r^{65}$) mod 4095. Similarly, in FIG. 3E, the second factor 63b is processed as a ratio of C=A/B where $r=Au+B$ in step 307. This result is then applied as a 6-bit table look-up of a logarithmic function in step 309.

While the invention has been described with respect to an illustrative embodiment thereof, it will be understood that various changes may be made in the method and means herein described without departing from the scope and teaching of the invention. Accordingly, the described embodiment is to be considered merely exemplary and the invention is not to be limited except as specified in the attached claims.

What is claimed is:

1. A method for controlling errors in an electronically recorded digital data message by performing at least one of a plurality of predetermined arithmetic operations on the data message in one or more of a plurality of subfields of a first $GF(2^{(m)(p)})$ or a second $GF(2^{(m)(q)})$ finite field, using an arithmetic unit including a plurality of multiplier gates and a plurality of addition gates, said method comprising steps of:

(a) factoring a first, second, and third composite number (m)(p), (m)(q), (p)(q) respectively wherein the first and second composite numbers are the number of bits designating each element in the first $GF(2^{(m)(p)})$ and second $GF(2^{(m)(q)})$ finite fields;

(b) forming a first primitive polynomial cubically extending each element in a first subfield $GF(2^{(m)})$ to the first finite field $GF(2^{(m)(p)})$, forming a second primitive polynomial quadratically extending each element in the first subfield $GF(2^{(m)})$ to the second finite field $GF(2^{(m)(q)})$, $q \neq p$, and forming a third primitive polynomial for quadratically extending each element in a second subfield $GF(2^{(p)(q)})$ to the first finite field $GF(2^{(m)(p)})$; and (c) performing at least one of the plurality of predetermined arithmetic operations on the data message by utilizing the arithmetic unit coupled to receive the data message, said arithmetic operations being selected either from a first group of operations associated with the first subfield as cubically extended to the first finite field or as quadratically extended to the second finite field, or selected from a second group of operations associated with the second subfield as quadratically extended to the first finite field, wherein the selected arithmetic operation is performed in the associated subfield.

2. The method for controlling errors according to claim 1, wherein the first and second finite fields are respectively $GF(2^{12})$ and $GF(2^8)$, and further wherein the first and second subfields are respectively $GF(2^4)$ and $GF(2^6)$.

3. The method for controlling errors according to claim 1, wherein the first group of operations includes multiplication, the inverse function, addition, and table-driven logarithmic functions, and further wherein the second group of operations includes the inverse function.

4. The method for controlling errors according to claim 1, wherein the first primitive polynomial is of the form ($v^3 + v + 1$), and further wherein the second and third primitive polynomials are of the form ($u^2 + u + 1$).

5. The method for controlling errors according to claim 1, wherein said method further comprises the steps of selectively recording on a storage medium said data messages as codewords in an algebraic block error correction code (ECC) decodable over the first finite field, reading selected recorded data messages, detecting any nonzero syndromes, and ascertaining the location of any errors in messages with nonzero syndromes.

6. The method according to claim 5, wherein said ascertaining of error location step includes the steps of performing at least one operation selected from the first group utilizing the arithmetic unit, said first group consisting of multiplication, the inverse function, addition, and table-driven logarithmic functions, said arithmetic operation being performed in the first subfield $GF(2^4)$.

7. The method according to claim 5, wherein said ascertaining of error location step includes the steps of performing at least one operation selected from the second group utilizing the arithmetic unit, said second group consisting of table-driven logarithmic functions, said arithmetic operation being performed in the second subfield $GF(2^6)$ quadratically extended to the first finite field $GF(2^{12})$.

8. The method according to claim 5, wherein the step of selectively recording data messages as codewords in an ECC decodable over a first $GF(2^{12})$ or a second $GF(2^8)$ finite field, and wherein the steps of detecting nonzero syndromes and ascertaining error locations include arithmetic operations selected from the first group and performed in the associated first $GF(2^4)$ subfield.

9. A logic arrangement for multiplicatively combining a first $r = r_0 + r_1 x + r_2 x^2$ and second $s = s_0 + s_1 x + s_2 x^2$ equal-length bit strings in a first $GF2^{12}$) finite field to produce an output string $t = t_0 + t_1 x + t_2 x^2 = r*s$, for controlling errors in an electronically recorded digital message, said multiplicative combining operating over a first subfield $GF(2^4)$ cubically extended to the first finite field, said arrangement comprising a plurality of multiplier gates and a plurality of addition gates arranged in satisfaction of the following logical relations such that for inputs $r_0$, $r_1$, and $r_2$ and $s_0$, $s_1$, and $s_2$ and outputs $t_0$, $t_1$, and $t_2$:

$$t_0 = (r_0 s_0 + r_1 s_1) + r_2 s_2 + (r_1 + r_2)(s_1 + s_2)$$
$$t_1 = r_0 s_0 + (r_1 + r_2)(s_1 + s_2) + (r_0 + r_1)(s_0 + s_1)$$
$$t_2 = (r_0 s_0 + r_1 s_1) + (r_0 + r_2)(s_0 + s_2).$$

10. An arithmetic unit in combination with an algebraic block ECC decoder for controlling errors in an electronically recorded digital data message by performing at least one of a plurality of predetermined arithmetic operations on the data message in one or more of a plurality of subfields of a first $GF(2^{(m)(p)})$ or a second $GF(2^{(m)(q)})$ finite field, comprising:

circuits responsive to the data message as received by the ECC decoder for performing at least one of the plurality of predetermined arithmetic operations on the data message, said arithmetic operations being selected either from a first group of operations associated with a first subfield $GF(2^{(m)})$ as cubically extended to the first finite field $GF(2^{(m)(p)})$ or as quadratically extended to the second finite field $GF(2^{(m)(q)})$, $q \neq p$, or selected from a second group of operations associated with a second subfield $GF(2^{(p)(q)})$ as quadratically extended to the first finite field $GF(2^{(m)(p)})$, wherein the selected arithmetic operation is performed in the associated subfield.

11. The arithmetic unit according to claim 10, wherein the first finite field is $GF(2^{12})$, the second finite field is $GF(2^8)$, the first subfield is $GF(2^4)$, and the second subfield is $GF(2^6)$.

12. The arithmetic unit according to claim 10, wherein said circuits include logic for logarithmically processing a numerical magnitude r, where $r = gL \neq 0$ in a finite field $GF(2^{2p})$ as a quadratic extension of $GF(2^p)$, L lying in the range $0 \leq L < M$, M being factorable, $M = (2^{2p} - 1) = J(K)$, and including reduced size first and second logarithmic tables.

13. An article of manufacture comprising a machine-readable memory having stored therein indicia of a plurality of processor executable control program steps for controlling errors in an electronically recorded digital data message by performing at least one of a plurality of predetermined arithmetic operations on the data message in one or more of a plurality of subfields of a first $GF(2^{(m)(p)})$ or a second $GF(2^{(m)(q)})$ finite field, said plurality of indicia of control program steps include:

(a) indicia of a control program step for factoring a first, second, and third composite number (m)(p), (m)(q), (p)(q) respectively wherein the first and second composite numbers are the number of bits designating each element in the first $GF(2^{(m)(p)})$ and second $GF(2^{(m)(q)})$ finite fields;

(b) indicia of a control program step for forming a first primitive polynomial cubically extending each element in a first subfield $GF(2^{(m)})$ to the first finite field $GF(2^{(m)(p)})$, forming a second primitive polynomial quadratically extending each element in the first subfield $GF(2^{(m)})$ to the second finite field $GF(2^{(m)(q)})$, $q \neq p$, and forming a third primitive polynomial for quadratically extending each element in a second subfield $GF(2^{(p)(q)})$ to the first finite field $GF(2^{(m)(p)})$; and (c) indicia of a control program step for performing at least one of the plurality of predetermined arithmetic operations on the data message by utilizing an arithmetic unit coupled to receive the data message, said arithmetic operations being selected either from a first group of operations associated with the first subfield as cubically extended to the first finite field or as quadratically extended to the second finite field, or selected from a second group of operations associated with the second subfield as quadratically extended to the first finite field, wherein the selected arithmetic operation is performed in the associated subfield.

* * * * *